US008006207B2

(12) United States Patent
Finkler

(10) Patent No.: US 8,006,207 B2
(45) Date of Patent: Aug. 23, 2011

(54) PARALLEL INTRUSION SEARCH IN HIERARCHICAL VLSI DESIGNS WITH SUBSTITUTING SCAN LINE

(75) Inventor: Ulrich A. Finkler, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 12/198,172

(22) Filed: Aug. 26, 2008

(65) Prior Publication Data

US 2010/0058265 A1    Mar. 4, 2010

(51) Int. Cl.
 *G06F 17/50* (2006.01)
(52) U.S. Cl. ........................................ 716/111; 716/125
(58) Field of Classification Search .................. 716/4, 7, 716/111, 125
 See application file for complete search history.

(56) References Cited

U.S. PATENT DOCUMENTS

| 5,267,177 A * | 11/1993 | Sato et al. ..................... 716/122 |
| 5,481,473 A | 1/1996 | Kim et al. |
| 5,497,334 A | 3/1996 | Russell et al. |
| 5,519,628 A | 5/1996 | Russell et al. |
| 5,528,508 A | 6/1996 | Russell et al. |
| 7,089,511 B2 | 8/2006 | Allen et al. |
| 2005/0132320 A1 | 6/2005 | Allen et al. |
| 2007/0011637 A1 | 1/2007 | Seidl et al. |

OTHER PUBLICATIONS

R. Nair, "Scanline Approach to Fast Extraction and Checking of Layouts Described Hierarchically", IBM Corporation, TDB n4b, Sep. 1992, pp. 163-164.

\* cited by examiner

*Primary Examiner* — Jack Chiang
*Assistant Examiner* — Brandon W Bowers
(74) *Attorney, Agent, or Firm* — Stephen J. Walder, Jr.; Preston J. Young

(57) ABSTRACT

Mechanisms are provided for performing intrusion searching of a hierarchical integrated circuit design. These mechanisms may receive the hierarchical integrated circuit design and perform a parallel intrusion search operation, that utilizes a substituting scan line, on the hierarchical integrated circuit design to identify intrusions of geometric objects in the hierarchical integrated circuit design. The mechanisms may further record intrusions of geometric objects in the hierarchical integrated circuit design identified by the parallel intrusion search operation. The parallel intrusion search operation may utilize a plurality of separate intrusion searches executed by the data processing system in parallel on the hierarchical integrated circuit design.

25 Claims, 8 Drawing Sheets

PARALLEL INTRUSION SEARCH IN HIERARCHICAL VLSI DESIGNS WITH SUBSTITUTING SCAN LINE

BACKGROUND OF THE INVENTION

1. Field of the Invention

The present application relates generally to an improved data processing apparatus and method. More specifically, the present application relates to mechanisms for performing parallel intrusion search operations in a hierarchical VLSI design using a substituting scan line.

2. Background of the Invention

A hierarchical Very Large Scale Integration (VLSI) integrated circuit design D consists of cells which contain instances of other cells and geometric objects. Geometric objects are polygons, lines, and points. An instance is the placement of the content of a cell C into the coordinate system of a cell P through a coordinate transform.

FIGS. 1A-1D provide a simple example of a hierarchical design representation. A cell A contains two instances B1 102 and B2 104 of a cell B and one rectangle 110 on a first layer, referred to as layer Blue. A cell B contains two instances 112 and 114 of cell C, which contains three rectangles 120-140 on layer Blue and three rectangles 150-170 on a second layer, referred to as layer Red. Thus, cell B may be expressed as a combination of instances of cell C and cell A may be expressed as a combination of instances of cell B.

As shown in FIG. 1D, for each hierarchical VLSI design D there exists an equivalent flat VLSI design $D_f$. A geometric object in $D_f$ has a one-to-one correspondence with an instance path in D. An instance path I representing a flat geometric object consists of a cell in D followed by a number of instances (there may be zero) and terminated by a reference to a geometric object in the lowest cell in the path. For example, an instance path in the example of FIG. 1D may be consist of cell node A, edge B2, cell node B, edge C2, and cell node C. Note that an instance path I that starts in a cell P that is not the top cell of design D expresses an entire set of instances. The set contains one element for each flat instance of cell P in design D. FIGS. 2A-2C illustrate a corresponding representation of each cell in a flattened form.

Analogously, there is a correspondence between an interaction between two geometric objects in $D_f$ and the two corresponding instance paths in D. Such an interaction is defined by two instance paths that start in the same cell P and optional interaction properties. If cell P is not the top cell, such an interaction represents an entire set of interactions, again one for each instance of cell P. Consequently, an interaction instance is defined by a tupelo consisting of a cell Q, a sequence of instance, and a reference to the interaction in the lowest cell P of the path.

An "intrusion" is an interaction, e.g., an overlap, between two or more geometric objects within a hierarchical VLSI design D. An interaction of limited distance expressed in a cell P that is not the top cell of D is also called a "nested intrusion." An interaction in $D_f$ which corresponds to an interaction instance whose path starts in the top cell of D, is called a "flat intrusion." There exists an intrusion I(d) between two geometric objects A and B in D if the minimum distance between the point sets, i.e. the collection of shapes, dots, lines, curves, etc., of geometric objects A and B, represented by the two instance paths, is equal to or less than a distance d in a specified metric M, typically the $L_\infty$ metric. The minimum distance between two point sets (e.g., two rectangles) in Euclidian metric is the length of the shortest line that exists which 'touches' both point sets, e.g., if the minimum distance d=0, then the shapes have to touch each other.

Intrusion searching in a hierarchical design D is the process of finding all intrusions for a given distance d for a specified subset of the geometric objects in a hierarchical VLSI design D in the most nested representation. The typical methodology to specify subsets of geometric objects in the design D that are of interest is through the specification of layers of the VLSI design, e.g., finding interactions between geometric shapes on one metal layer or another.

BRIEF SUMMARY OF THE INVENTION

In one illustrative embodiment, a method, in a data processing system, is provided for performing intrusion searching of a hierarchical integrated circuit design. The method may comprise receiving the hierarchical integrated circuit design and performing a parallel intrusion search operation, that utilizes a substituting scan line, on the hierarchical integrated circuit design to identify intrusions of geometric objects in the hierarchical integrated circuit design. The method may further comprise recording intrusions of geometric objects in the hierarchical integrated circuit design identified by the parallel intrusion search operation. The parallel intrusion search operation may utilize a plurality of separate intrusion searches executed by the data processing system in parallel on the hierarchical integrated circuit design.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

The illustrative embodiments provide a mechanism for performing an intrusion search in a hierarchical VLSI design using an efficient scan line (plane sweep) algorithm while creating a large number of completely independent sub-processes to allow scalable parallelism. Such intrusion searches may be performed during a VLSI design verification stage in order to perform such VLSI design verification. Design verification is the process by which the correctness of the physical design for a VLSI integrated circuit is determined. Design verification includes checking that the geometrical designs of the mask shapes to be fabricated do not violate the rules defined for the integrate circuit fabrication process; checking that the electrical design of the integrated circuit lies within permitted tolerances; and checking that the layout of the physical design matches or is electrically equivalent to the design intent. The design rules that are checked for compliance consist of specifications that restrict or constrain the geometric or electrical use of design components. The geometry-based checks are intended to search for intrusions between shapes on a first (base) level and shapes on a second (ancillary) level, where an intrusion occurs when two or more shapes are within some defined region of interest from one another.

Typically, intrusion searches cannot be performed optimally using parallel processes because the hierarchical nature of the VLSI design causes such parallel processes to perform repetitions work. Thus, the advantages of performing the various intrusion search operations in parallel are essentially offset by the inefficiencies of performing repetitious work. The illustrative embodiments, however, provide mechanisms for allowing parallel processing of an intrusion search operation for a hierarchical VLSI design using a scan line substitution mechanism. With the illustrative embodiments, the intrusion search operation is separated into independent sub-tasks that may be executed in parallel. The separation into independent sub-tasks is made possible by partitioning the operation of the scan line substitution mechanism into sub-tasks such that each sub-task computes the intrusions that "live" in a given cell of the hierarchical design and filtering out intrusions that do not "live" in the given cell.

Figure 1A:
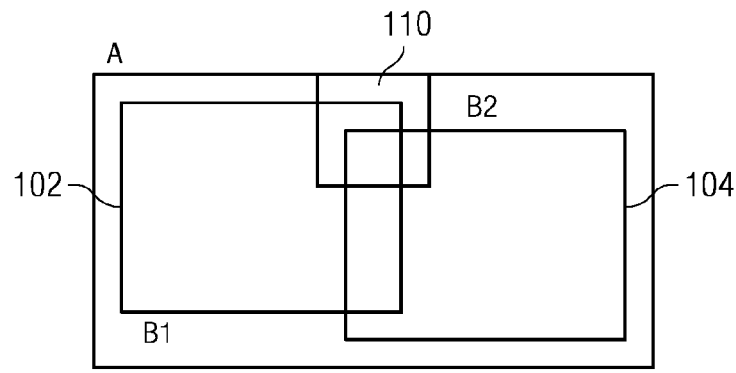
FIGS. 1A-1D provide a simple example of a hierarchical design representation.
Figure 1B:
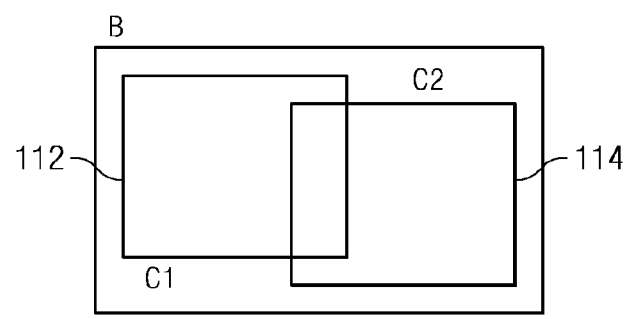
Figure 1C:
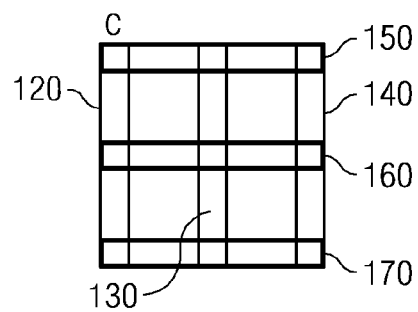
Figure 1D:
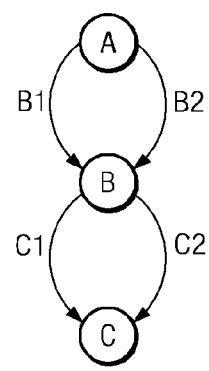
Figure 2A:
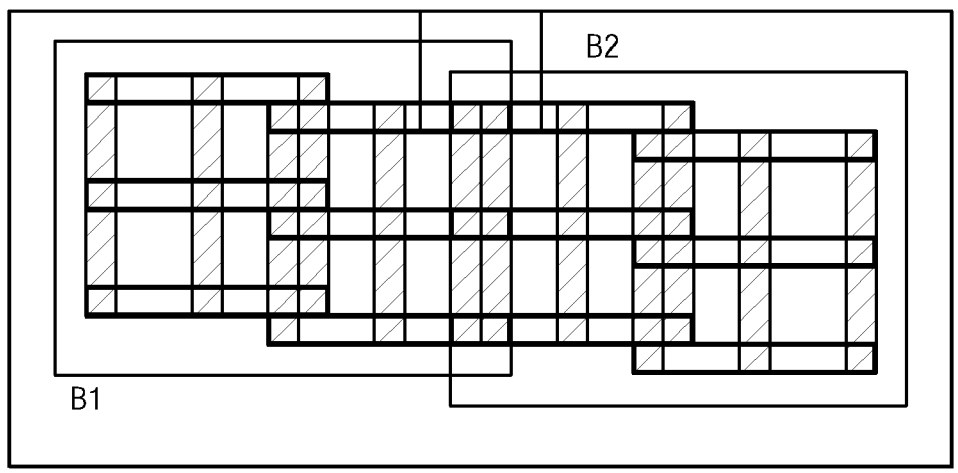
FIGS. 2A-2C illustrate a representation of each cell in a flattened form corresponding to the example of FIGS. 1A-1C.
Figure 2B:
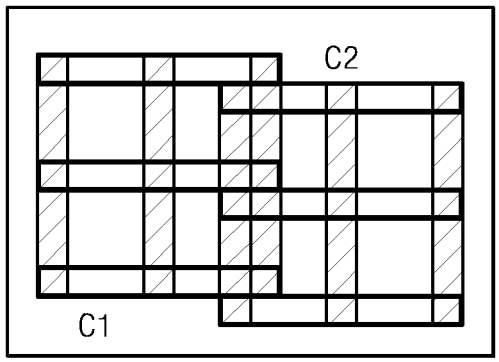
Figure 2C:
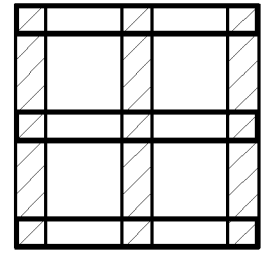
Figure 3:
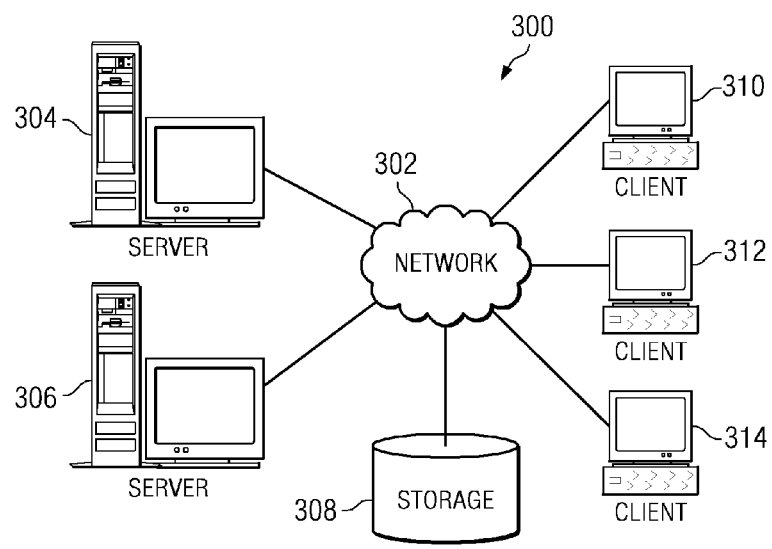
FIG. 3 is an example diagram of a distributed data processing system in which aspects of the illustrative embodiments may be implemented.
Figure 4:
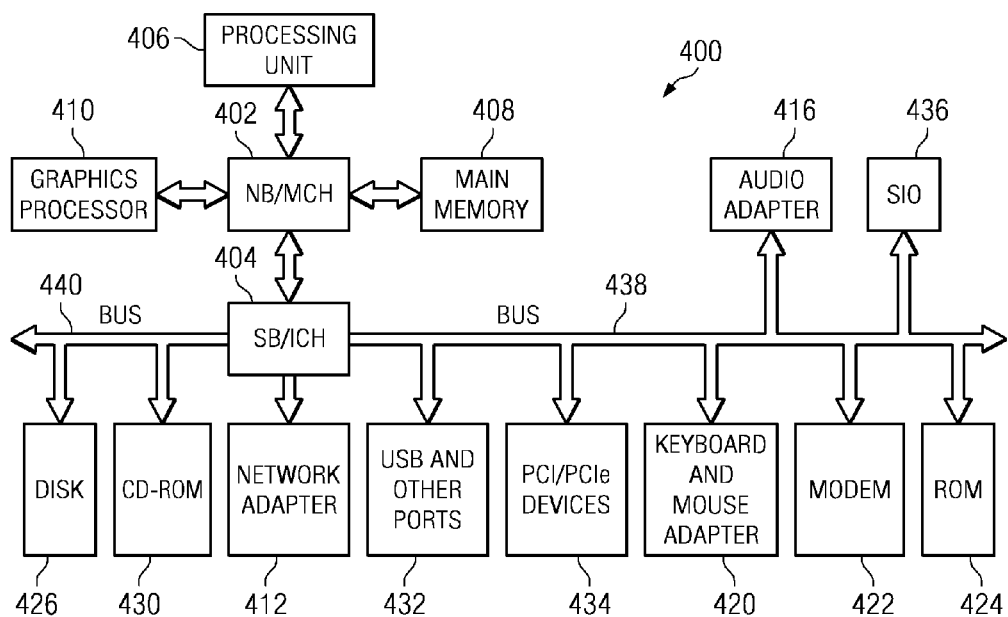
FIG. 4 is an example of a data processing device in which exemplary aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIGS. 3 and 4 are provided hereafter as example environments in which aspects of the illustrative embodiments may be implemented. While the description following FIGS. 3 and 4 will focus primarily on a single data processing device implementation, this is only an example and is not intended to state or imply any limitation with regard to the features of the present invention. To the contrary, the illustrative embodiments are intended to include distributed data processing environments and any other embodiments in which the parallel intrusion search mechanisms of the illustrative embodiments may be implemented.

With reference now to the figures and in particular with reference to FIGS. 3-4, example diagrams of data processing environments are provided in which illustrative embodiments of the present invention may be implemented. It should be appreciated that FIGS. 3-4 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 3 depicts a pictorial representation of an example distributed data processing system in which aspects of the illustrative embodiments may be implemented. Distributed data processing system 300 may include a network of computers in which aspects of the illustrative embodiments may be implemented. The distributed data processing system 300 contains at least one network 302, which is the medium used to provide communication links between various devices and computers connected together within distributed data processing system 300. The network 302 may include connections, such as wire, wireless communication links, or fiber optic cables.

In the depicted example, server 304 and server 306 are connected to network 302 along with storage unit 308. In addition, clients 310, 312, and 314 are also connected to network 302. These clients 310, 312, and 314 may be, for example, personal computers, network computers, or the like. In the depicted example, server 304 provides data, such as boot files, operating system images, and applications to the clients 310, 312, and 314. Clients 310, 312, and 314 are clients to server 304 in the depicted example. Distributed data processing system 300 may include additional servers, clients, and other devices not shown.

In the depicted example, distributed data processing system 300 is the Internet with network 302 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 300 may also be implemented to include a number of different types of networks, such as for example, an intranet, a local area network (LAN), a wide area network (WAN), or the like. As stated above, FIG. 3 is intended as an example, not as an architectural limitation for different embodiments of the present invention, and therefore, the particular elements shown in FIG. 3 should not be considered limiting with regard to the environments in which the illustrative embodiments of the present invention may be implemented.

With reference now to FIG. 4, a block diagram of an example data processing system is shown in which aspects of the illustrative embodiments may be implemented. Data processing system 400 is an example of a computer, such as client 310 in FIG. 3, in which computer usable code or instructions implementing the processes for illustrative embodiments of the present invention may be located.

In the depicted example, data processing system 400 employs a hub architecture including north bridge and memory controller hub (NB/MCH) 402 and south bridge and input/output (I/O) controller hub (SB/ICH) 204. Processing unit 406, main memory 408, and graphics processor 410 are connected to NB/MCH 402. Graphics processor 410 may be connected to NB/MCH 402 through an accelerated graphics port (AGP).

In the depicted example, local area network (LAN) adapter 412 connects to SB/ICH 404. Audio adapter 416, keyboard and mouse adapter 420, modem 422, read only memory (ROM) 424, hard disk drive (HDD) 426, CD-ROM drive 430, universal serial bus (USB) ports and other communication ports 432, and PCI/PCIe devices 434 connect to SB/ICH 404 through bus 438 and bus 440. PCI/PCIe devices may include, for example, Ethernet adapters, add-in cards, and PC cards for notebook computers. PCI uses a card bus controller, while PCIe does not. ROM 424 may be, for example, a flash basic input/output system (BIOS).

HDD 226 and CD-ROM drive 430 connect to SB/ICH 404 through bus 440. HDD 426 and CD-ROM drive 430 may use, for example, an integrated drive electronics (IDE) or serial advanced technology attachment (SATA) interface. Super I/O (S10) device 436 may be connected to SB/ICH 404.

An operating system runs on processing unit 406. The operating system coordinates and provides control of various components within the data processing system 400 in FIG. 4. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 400 (Java is a trademark of Sun Microsystems, Inc. in the United States, other countries, or both).

As a server, data processing system 400 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 400 may be a symmetric multiprocessor (SMP) system including a plurality of processors in processing unit 406. Alternatively, a single processor system may be employed.

Instructions for the operating system, the object-oriented programming system, and applications or programs are located on storage devices, such as HDD 426, and may be loaded into main memory 408 for execution by processing unit 406. The processes for illustrative embodiments of the present invention may be performed by processing unit 406 using computer usable program code, which may be located in a memory such as, for example, main memory 408, ROM 424, or in one or more peripheral devices 426 and 430, for example.

A bus system, such as bus 438 or bus 440 as shown in FIG. 4, may be comprised of one or more buses. Of course, the bus system may be implemented using any type of communication fabric or architecture that provides for a transfer of data between different components or devices attached to the fabric or architecture. A communication unit, such as modem 422 or network adapter 412 of FIG. 4, may include one or more devices used to transmit and receive data. A memory may be, for example, main memory 408, ROM 424, or a cache such as found in NB/MCH 402 in FIG. 4.

Those of ordinary skill in the art will appreciate that the hardware in FIGS. 3-4 may vary depending on the implementation. Other internal hardware or peripheral devices, such as flash memory, equivalent non-volatile memory, or optical disk drives and the like, may be used in addition to or in place of the hardware depicted in FIGS. 3-4. Also, the processes of the illustrative embodiments may be applied to a multiprocessor data processing system, other than the SMP system mentioned previously, without departing from the spirit and scope of the present invention.

Moreover, the data processing system 400 may take the form of any of a number of different data processing systems including client computing devices, server computing devices, a tablet computer, laptop computer, telephone or other communication device, a personal digital assistant (PDA), or the like. In some illustrative examples, data processing system 400 may be a portable computing device which is configured with flash memory to provide non-volatile memory for storing operating system files and/or user-generated data, for example. Essentially, data processing system 400 may be any known or later developed data processing system without architectural limitation.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In the distributed data processing system 300 of FIG. 3, users of client computing devices 310, 312, and 314 may collaborate on the design of a very large scale integrated (VLSI) circuit using one or more tools provided by one or more server computing devices, such as servers 302 and 304, for example. Alternatively, in some cases, a user of an individual computing device 310 may generate such a design using tools provided on the individual computing device 310. As part of this process, a physical design of the VLSI circuit is generated. A physical design is a set of mask shapes that denote the design of an integrated circuit. Within the physical design, a shape is a planar set of points and the bounding edges they define. The physical design of an integrated circuit is expressed in the form of a hierarchical layout, which consists of duplicate instances of basic design components connected together to form a complex design. The hierarchical layout characterizes the design as nested data, i.e. as design components retained and embedded as much as possible in the design. In contrast to nested data, flat (or flattened) design data has all or its shapes transformed to the highest level of the design, and thus expressed in a non-hierarchical (flat) form.

The illustrative embodiments, as may be provided in the data processing system 400 in FIG. 4, for example, may operate on such a hierarchical VLSI design so as to implement a parallel intrusion search using a substituting scan line mechanism in order to identify intrusions of geometric objects in the VLSI design, i.e. overlaps of the objects. Such intrusion search may be performed as part of a design verification operation so as to verify that the VLSI design adheres to geometric and electrical requirements. Once such a parallel intrusion search is performed, there are many applications that may use the results of such a parallel intrusion search. For example, the electrical connectivity that would be achieved if the design were manufactured may be computed and compared against the intended logical functionality, this is referred to as Layout Versus Schematic (LVS) checking. If such checking identifies an electrical short in the logic, the intrusions can be used to search for the short. Intrusions may also be used when performing geometric operations on a hierarchical design for Design Rule Checking (DRC) or device extraction.

In one illustrative embodiment, the scan line algorithm, also referred to as a plane sweep algorithm, implemented by the scan line mechanism utilizes an interval tree data structure. An interval tree data structure is a data structure that stores a set $S_i$ of intervals [a, b], i.e. a range of coordinates on a coordinate axis, such that range queries can be answered with optimal complexity. Complexity is the common measure for how many compute instructions are necessary to execute a given algorithm. The complexity is optimal if it can be proven that there is a lower bound which is identical within a precisely defined variation, e.g., a constant factor. A range query is of the following type: Given as set of intervals S and an interval Q, which intervals in S have points in common with Q? The answer to a range query [q1, q2], where q1 and q2 are points on a coordinate axis, such that [q1, q2] is an interval, namely the interval Q in the definition of a range query above, is the subset $S_q \square S_i$ such that all [a, b]$\square S_q$ intersect the interval [q1, q2] (This sentence is basically the more formal definition of range query). The answer is provided using O(log N+k) operations, where N is the number of intervals in $S_i$ and k is the size of the answer. N is at most the number of flat shapes in the design. For typical designs and small interaction distances, N is closer to the number of nested shapes and instances in the design.

A dynamic interval tree supports not only the range query operations, but also "insert" and "delete" operations for inserting and deleting intervals in the interval tree or into the set S on which the range queries Q are performed. In one illustrative embodiment, red-black interval trees, such as described in Cormen et al., "Algorithms", MIT Press, 1993, are used as the binary sub-trees of the interval tree in order to efficiently support dynamic updates of the interval tree. Red-black interval trees have the advantage of using at most one rotation per update operation while still guaranteeing a complexity of O(log N) for search (or query since a search is in the form of a range query), insertion, and deletion. A rotation is a standard term in the area of binary trees and refers to an operation that alters the structure of the tree while maintaining the governing constraint of the tree, typically that all objects in the left subtree of a node n are <=than n and all objects in the right subtree are >=n.

Figure 5:
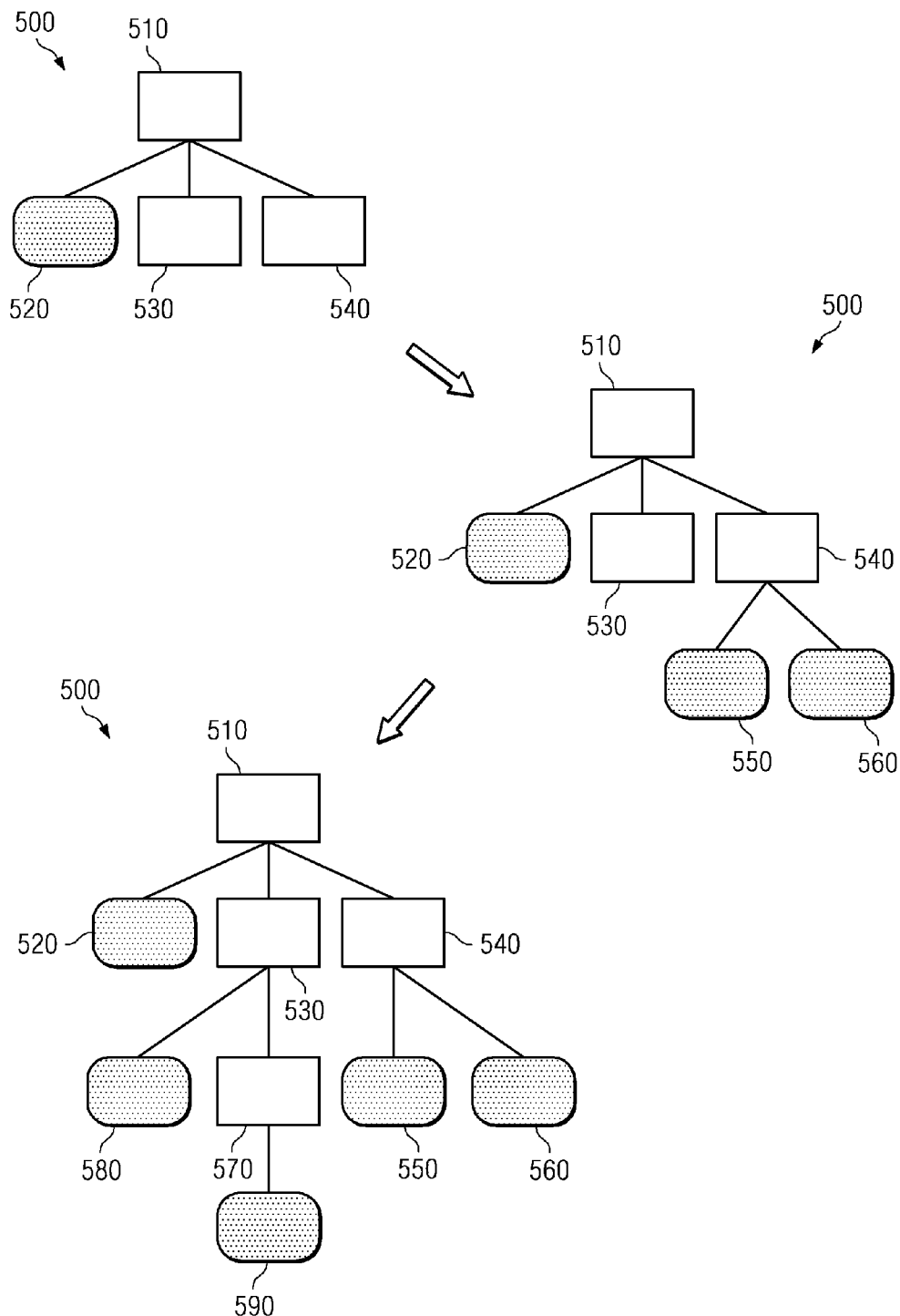
FIG. 5 is an example of a representation of an intrusion search algorithm in the form of an hierarchical dynamic interval tree.

As shown in FIG. 5, an intersection of a scan line of an intrusion search, or plane-sweep, algorithm with a hierarchical design can be represented in the form of an hierarchical dynamic interval tree. A scan line (sometimes also called plane-sweep) is a standard technique in computational geometry. A straight line, typically vertical or horizontal, is moved orthogonally to its direction across the plane with the geometric objects (point sets) on which a computation is performed. The algorithm considers at any point in time only the objects that intersect the scan line. A standard scan line algorithm is typically described in terms of 3 basic operations on an organizing structure that holds all objects that intersect the conceptual scan line at any given point in time: insertion, deletion, and search. Depending on the specific algorithm, the searches can be of different types, e.g., a binary search or, in the case of the illustrative embodiments, a range query. Thus, for purposes of this description, the terms "range query," "query," and "search" are intended to refer to a range query such as that previously described above.

In FIG. 5, the root of the hierarchical dynamic interval tree corresponds with the top cell of the design hierarchy. The children of a node P in the tree (corresponding to a cell P in the design) corresponds with the instances and geometric objects in P that intersect the scan line. Thus, an "internal node" corresponds to a cell P and contains a dynamic interval tree that holds exactly one entry for each of its children. A child node is an instance of another cell or a geometric object whose lease enclosing rectangle (LER) intersects the scan line at its current position. A leaf node is a geometric object. Leaf nodes do not have children and are part of the dynamic interval tree of an internal node.

As shown in FIG. 5, the hierarchical dynamic interval tree 500 is built dynamically with refinements of the hierarchical dynamic interval tree 500 being performed on internal nodes in response to the internal node being "hit" by a query of the intrusion search. In the depiction of FIG. 5, shaded boxes represent leaf nodes while non-shaded boxes represent internal nodes. When refined, an internal node contains an interval tree. As shown, initially the hierarchical dynamic interval tree 500 is refined only within the top cell of the design. Refinement adds sub-trees under more and more internal nodes. Thus, as shown in FIG. 5, initially the top cell node 510 has three child nodes 520-540 with node 520 being a leaf node and nodes 530-540 being internal nodes. As the intrusion search continues, the initial tree is refined, in response to the scan line "hitting" the node 540, i.e. the query of the intrusion search being matched by the node 540, to include the sub-tree of the node 540 comprising leaf nodes 550-560. Similarly, as the intrusion search continues, node 530 is expanded to include its sub-tree comprising internal node 570 and leaf nodes 580-590.

The average complexity for a range query in a hierarchical dynamic interval tree for a VLSI design is O(sqrt(N) log(sqrt(N))+k). This complexity is based on the assumption that the average cell contains a constant number of objects and that the average size of a leaf object is very small compared to the size of the design. This is sufficiently well satisfied for well nested designs, i.e. designs where, when comparing two designs of different size but identical design style, the average number of children per cell does not grow proportional to the design size.

Figure 6:
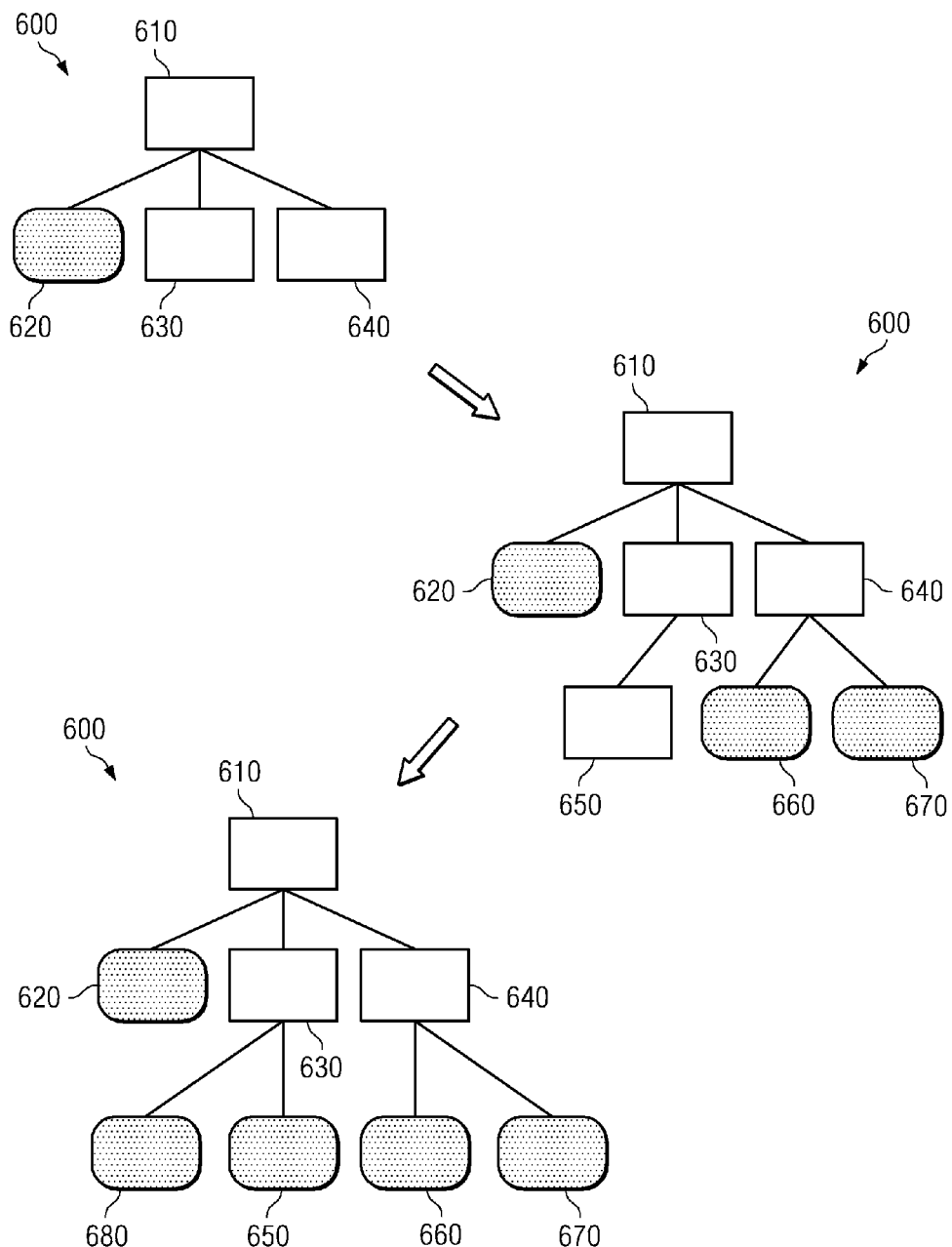
FIG. 6 is an example of the building up of a partially hierarchical dynamic interval tree.

FIG. 6 illustrates the building up of a partially hierarchical dynamic interval tree. A partially hierarchical dynamic interval tree is a hierarchical dynamic interval tree with only two levels of internal nodes and one level of leaf nodes. With a partially hierarchical dynamic interval tree, an internal node corresponds either to the top cell of the design D or an instance of a cell in design D. The root node is an internal node that corresponds to the top cell of the design D. A leaf node corresponds to an instance path to a geometric object or an instance path to an instance of a cell C. A leaf node corresponding to an instance is replaced with its children when it is hit by a query except for the first two levels of the hierarchy.

Thus, looking at FIG. 6, a schematic of a partially hierarchical dynamic interval tree 600 with different states of refinement is shown. As shown in FIG. 6A, node 610 is the root node corresponding to the top cell of the design D. nodes 620-640 represent child nodes of the root node 610 with node 620 being a leaf node (shaded) and nodes 630-640 being internal nodes (non-shaded). As the intrusion search continues, the initial tree is refined, in response to the scan line "hitting" the node 630, i.e. the query of the intrusion search being matched by the node 630, to include the sub-tree of the node 630 comprising internal node 650. Similarly, the node 640 is also "hit" by the intrusion search and its leaf nodes 660-670 are added to the partially hierarchical dynamic interval tree 600. Thereafter, when the node 640 is hit by the intrusion search, it is replaced with its leaf nodes 680-690.

Compared to a hierarchical dynamic interval tree 500, the partially hierarchical dynamic interval tree 600 stores more status information, e.g., entire instance paths, and uses more book-keeping operations, but a query has better average search complexity. Under the assumptions outlined above, the average complexity for a range query is O(log(sqrt(N))+k).

In order to allow for scalable parallel processing, the illustrative embodiments partition intrusion searches into independent sub-problems to minimize the amount of communication that is necessary. On the other hand, the illustrative embodiments seek to take full advantage of the significant compression that is achieved by the hierarchical dynamic interval tree design representation. It should be noted, however, that working in a compressed domain, such as in the hierarchical dynamic interval tree design representation, prohibits almost any form of partitioning by region. If the design were described flat, the plane could be partitioned, e.g., into four quadrants to obtain mostly independent sub-problems which only interact at their boundaries. In a hierarchical representation, breaking the plane into quadrants will not create this degree of independence, since each quadrant will inherit a copy of the sub-problem of processing a nested cell since it requires a copy of that cell, basically undoing part of the compression that is achieved by the hierarchical representation. Partitioning by objects is also problematic since the intrusions for a nested object J in a cell P can reach into any cell in the hierarchy. That is, an intrusion can hit J from above or below in the hierarchy.

The illustrative embodiments address such problems by partitioning intrusions according to where they "live." An intrusion is a pair of instance paths which define to flat shape instances in the plane. The pair of instance paths start in the same cell of the hierarchy. An intrusion 'lives' in the cell in the hierarchy where its two paths start.

For example, if one considers the optimization problem of finding the most nested description of the flat interactions in the design, then the flat interactions can be canonically partitioned into disjoint sets. Each set contains all the flat interactions that can be expressed by a single intrusion that "lives" in a cell P, i.e. both instance paths start in P. The set contains one flat interaction for each flat instance of P.

A substituting scan line algorithm partitions the problems into independent tasks such that each task computes the intrusions that live in a given cell P and belong to the same layer combination. It should be noted that finding intrusions that live in a cell P involves instances of objects in the entire sub-hierarchy of the cell P. Thus, the algorithm evaluates intrusions adjacent to the instance J of an object in cell P, but the majority of these intrusions may not live in cell P.

As described hereafter, the illustrative embodiments provide mechanisms for avoiding having to spend a significant amount of time on intrusions that do not "live" in a cell which is the scope of the intrusion search. This minimizes the impact on scalability of intrusion searches due to intrusions that are not of interest for the current task. Altogether, the mechanisms of the illustrative embodiments generate completely independent sub-tasks along two dimensions, the relevant layer interactions of the design and the cells in the design. Such independent sub-tasks provide a good base for parallel processing.

The illustrative embodiments use a substituting scan line mechanism. The substituting scan line mechanism sweeps a scan line through the cell P of interest for a specific task, descending into the hierarchy only where necessary. An example data flow for this substituting scan line mechanism is provided in FIG. 7.

Figure 7:
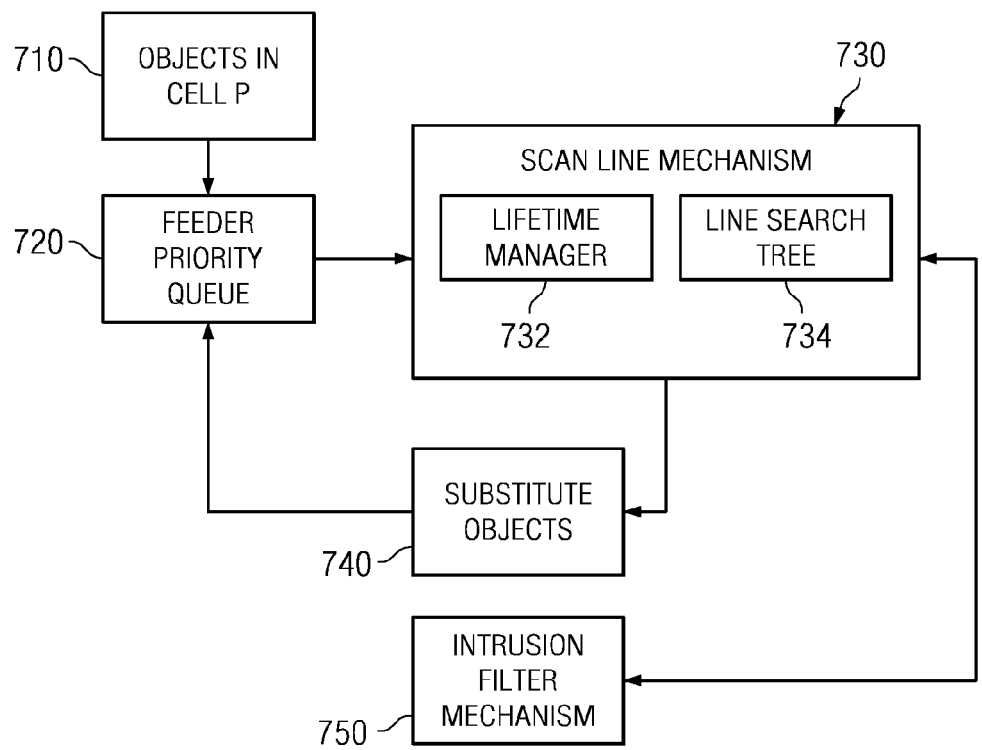
FIG. 7 is an example data flow for a substituting scan line mechanism in accordance with one illustrative embodiment.

As shown in FIG. 7, the data flow 700 starts with objects in a cell P 710 being provided to a feeder priority queue (FPQ) 720. The FPQ 720, in one illustrative embodiment, is a priority queue which dynamically orders design object instances and shapes left to right by leftmost coordinate. The FPQ 720 supports operations such as Delete Minimum, which finds the leftmost entry and removes it from the FPQ 720, and Insert, which adds a new object to the FPQ 720.

The FPQ 720 is preloaded with the least enclosing rectangles (LERs) in the cell of interest, e.g., cell P. In left to right order, objects are taken from the FPQ 720. The intersection of the new object with the scan line 730 forms the query to the hierarchical interval tree which contains objects that are currently on the scan line, i.e. intersecting the scan line at its current position. The scan line 730 is comprised of a lifetime manager 732 and a line search tree 734. The lifetime manager 732 is a priority queue which dynamically orders design object instances left to right by rightmost coordinate. Object instances with the same rightmost coordinate are ordered in a descending manner by the length of their instance path. The line search tree 734 is a (partially) hierarchical dynamic interval tree based on intervals obtained by intersecting LERs of design objects and instances with the scan line.

A query causes LERs representing an instance to be refined as far as necessary to answer the query. Refining creates additional objects that have to be processed, i.e. substitute objects 740. Substitute objects that are completely to the left of the scan line 730 are dropped. Substitute objects 740 that intersect the scan line 730 are added to the scan line 730. The scan line moves with it starting at the left boundary of the design and being initially empty. The scan line moves left to right and when it hits, i.e. intersects, with an object, this object is added to the scan line. When the scan line stops hitting an object because it has moved on, that object is removed from the scan line. Substitution replaces or refines (depending on the particular embodiment) an object on the scan line that represents a design cell, with its content.

Substitute objects 740 that are completely to the right of the scan line 730 are added to the FPQ 720. As the scan line 730 moves, objects move from the FPQ 720 into the scan line 730 and are then dropped by the same criteria outlined for substitute objects 740 above.

The choice of data structure for the line search tree 734 determines the character of the substitute objects 740. If a hierarchical dynamic interval tree is chosen, substitute objects 740 add the children to the scan line 730 and the FPQ 720. If a partially hierarchical dynamic interval tree is chosen, substitute objects replace objects, i.e. deletions and insertions occur in the scan line 730 and the FPQ 720 based on a more elaborate scheme described hereafter.

With the mechanisms of the illustrative embodiments, each time a new object, i.e. an instance path I starting in a currently processed cell P, is taken from the FPQ 720, a search is triggered. This search involves issuing a range query to the interval tree for cell P with the y-interval covered by the instance path I in the coordinate system of cell P. If the query is a leaf object, and the query hits a leaf object, then an intrusion has been found. If the query is a leaf object, but the query hits an internal node, the internal node is refined if necessary and the query is used to the sub-interval tree. What is meant by the query "being" a leaf object is that objects encountered by the scan line trigger events and when an object is first touched by the scan line, it triggers a query to find other objects that already intersect the scanline its current position which interact with the new object.

If the query was an cell instance LER, and the query hit is a leaf object, then the query is refined into the scan line 730 and FPQ 720. That is, if the query was triggered by an LER representing a cell, then it is refined into a set of more detailed objects (the content of the LER), which themselves all have not triggered a query yet, so they will trigger future queries. If the query was an cell instance LER, and the query hit is an internal node, then the internal node is refined if necessary and the query is issued to the sub-interval tree.

The search mechanism described above finds all of the intrusions that "live" in the entire sub-hierarchy rooted in cell P, not only those that live in cell P. However, there is a criterion, that is efficient to evaluate, that may be used to filter the search so as to cause the results to be directed to only those intrusions that "live" in the cell P. This filter is implemented as the intrusion filter 750 in FIG. 7.

The filtering task is to identify intrusions that do not "live" in the cell P, but in a descendant of the cell P. For intrusions that do not live in the cell P, at least the first step on the instance paths is identical. The first intrusion search with a new object is performed in the top interval tree, which contains relatively few entries (in the average over all cells it is assumed that this is a moderately sized constant for well nested VLSI designs). The filtering is achieved by not issuing recursive queries if the query object is not a leaf object and its first step coincides with the instance representer, i.e. an LER which stands for an instance of a cell and thus all its content, hit by the top level query, i.e. a query triggered by an object which is a direct descendent of the prime cell of the design (the top cell).

If the number of objects in the top cell is X, then the work spent on irrelevant queries is O(sqrt(X)+k) under the assumption of small and evenly distributed objects. In the worst case this work is O(A). If X is a constant in the average as outlined above, only constant time per processed object is spent on irrelevant searches in the average over all cells.

As discussed above, when an internal node is "hit" by the scan line, it is refined based on its sub-tree in the hierarchical dynamic interval tree so that the sub-tree is added to the hierarchical dynamic interval tree (see FIGS. 5 and 6 above). In the case in which a hierarchical dynamic interval tree is utilized, the sub-tree is added to the hierarchical dynamic interval tree below the internal node that is "hit" by the scan line. In this way, the "content" of the refined internal node object is added to the recursive search tree. However, for partially hierarchical dynamic interval tree implementations, it is not sufficient to add the content of the refined object to a recursive search tree.

Figure 8:
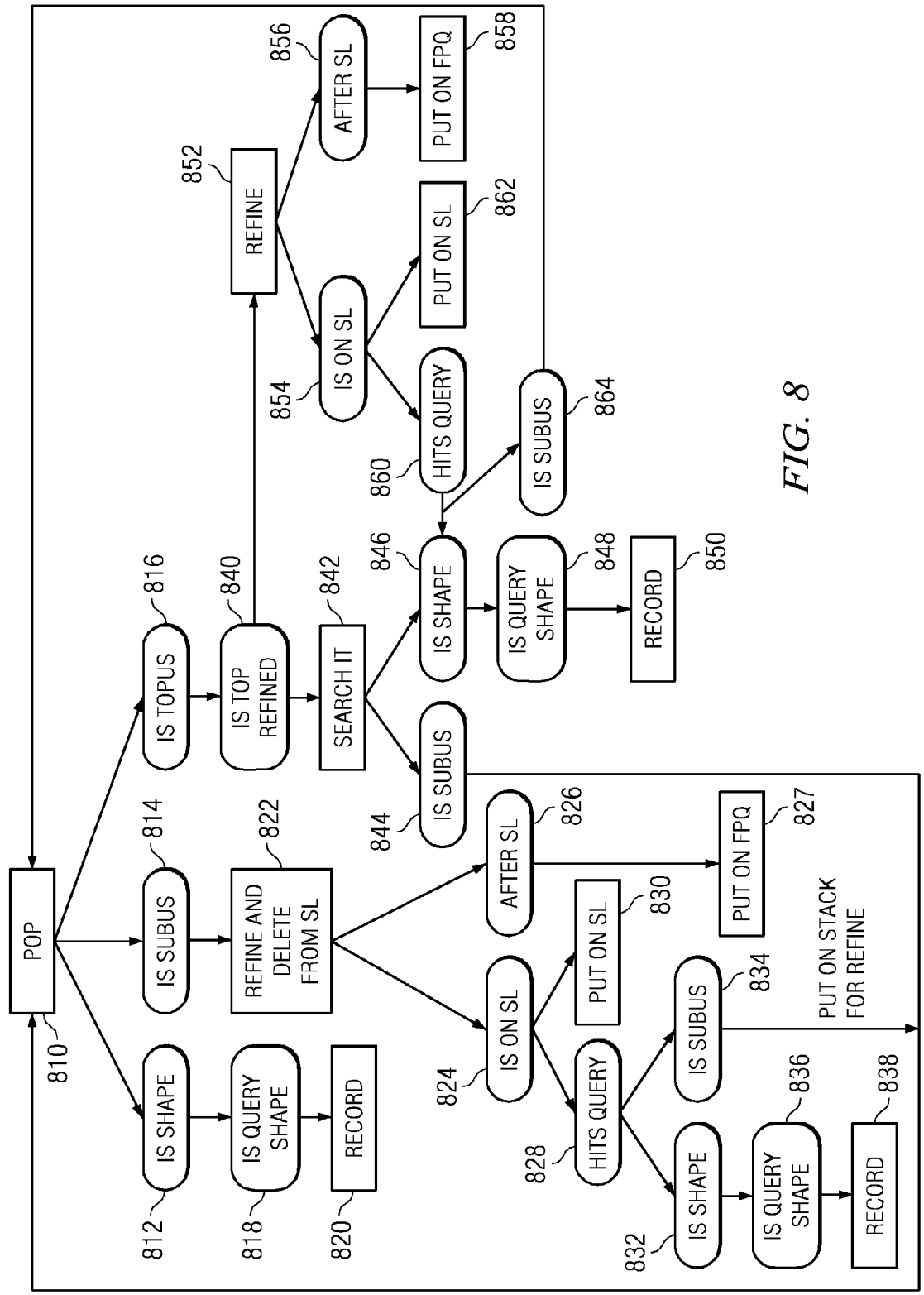
FIG. 8 is a diagram outlining an example data flow of a refinement operation for partially hierarchical dynamic interval trees (PHDITs) in accordance with one illustrative embodiment.

FIG. 8 is a diagram outlining an example data flow of a refinement operation for partially hierarchical dynamic interval trees (PHDITs) in accordance with one illustrative embodiment. With the data flow in FIG. 8, a stack is used to drive the recursive refinement operation. The stack is preloaded with one internal node hit by the top level query. Objects are popped off the stack and processed until the stack is empty. There are four cases for an object obtained from the stack:

(1) The object is a leaf object, i.e. a shape, in which case, either an intrusion has been found or the query needs to be refined and refinement terminates;

(2) The object is an internal node, but not one residing in the cell P that is being searched, in which case, the object is removed from the scan line and its children move either into the FPQ 720 in FIG. 7, or into the scan line 730. Children that move into the scan line 730 require further processing if they hit the query:
  a. if the child is a leaf node, it is processed like a leaf object obtained from the stack;
  b. if the child is an internal node, it is pushed onto the stack;

(3) The object is an internal node residing in cell P that is refined, in which case a recursive search is performed and the results are processed in a manner analogous to (2a) and (2b) above; and (4) The object is an internal node residing on cell P that is not refined, in which case the object is refined, but not removed and the substitute objects are processed analogous to (2) above.

With reference now again to FIG. 8, this operation is shown as follows. As shown in FIG. 8, the operation starts by popping the next object off of the stack 810. A determination is made as to whether the object is a shape (leaf node) 812, a subusage (internal node) 814, or a top usage 816. If the object is a shape, and the query is a shape 818, then an intrusion associated with the object is recorded 820.

If the object is a subusage, i.e. an internal node, then the object is refined and deleted from the scan line 822. For each child object, it is determined if the child object is on the scan line 824 or is after the scan line 826. If the child object is after the scan line, then the child objects is added to the FPQ 720 in FIG. 7. If the child object is on the scan line, a determination is made as to whether the child object hits the query 828. If the child object does not hit the query, the child object is added to the scan line 830. If the child object does hit the query 830, a determination is made as to whether the child object is a shape 832 or a subusage 834. If the child object is a subusage, the child object is placed on the stack for refinement and the operation returns to 810. If the child object is a shape, and the query is a shape 836, then an intrusion associated with that child object is recorded 838.

If the object that was popped off the stack 810 is a top usage 816, i.e. a usage that is a direct descendent of the top cell (the highest level a usage can exist at), a determination is made as to whether the object has been refined or not. If the object has been refined 840, then the object is searched 842 and a determination is made as to whether the object is a subusage 844 or a shape 846. If the object is a subusage 844, then the object is placed on the stack and the operation returns to 810. If the object is a shape, and the query is a shape 848, then the object is recorded as an intrusion 850.

If the object is a top usage object and it is not refined, then the object is refined 852 but is not deleted from the scan line. For the object's child objects, it is determined whether the child object is on the scan line 854 or after the scan line 856. If the child object is after the scan line, then the child objects is added to the FPQ 720 in FIG. 7 858. If the child object is on the scan line, a determination is made as to whether the child object hits the query 860. If the child object does not hit the query, the child object is added to the scan line 830. If the child object does hit the query 830, a determination is made as to whether the child object is a considered a subusage and is placed on the stack for refinement with the operation returning to 810. If the child object is a shape 846, and the query is a shape 848, then an intrusion associated with that child object is recorded 850. The operation terminates when there are no further objects to pop off the stack at 810.

The filtering mechanism as described above ensures that no intrusion is recorded twice for any search object. Thus, the use of the substituting scan line mechanism 700 of FIG. 7 with the filtering mechanism 750 operating in the manner outlined in FIG. 8, a mechanism is provided by the illustrative embodiments in which the task of intrusion searches may be separated into separate tasks associated with performing intrusion searches of only those intrusions that "live" within a particular cell of the VLSI design. Thus, multiple separate tasks, each for a different cell of the VLSI design, may undergo intrusion searches in a parallel manner through parallel processing by processors in a data processing system such as that described above with regard to FIGS. 3 and 4. This greatly increases the speed and efficiency with which such intrusion searches may be performed, especially when considering complex VLSI designs having thousands of objects and geometric shapes upon which to perform such intrusion searches.

Figure 9:
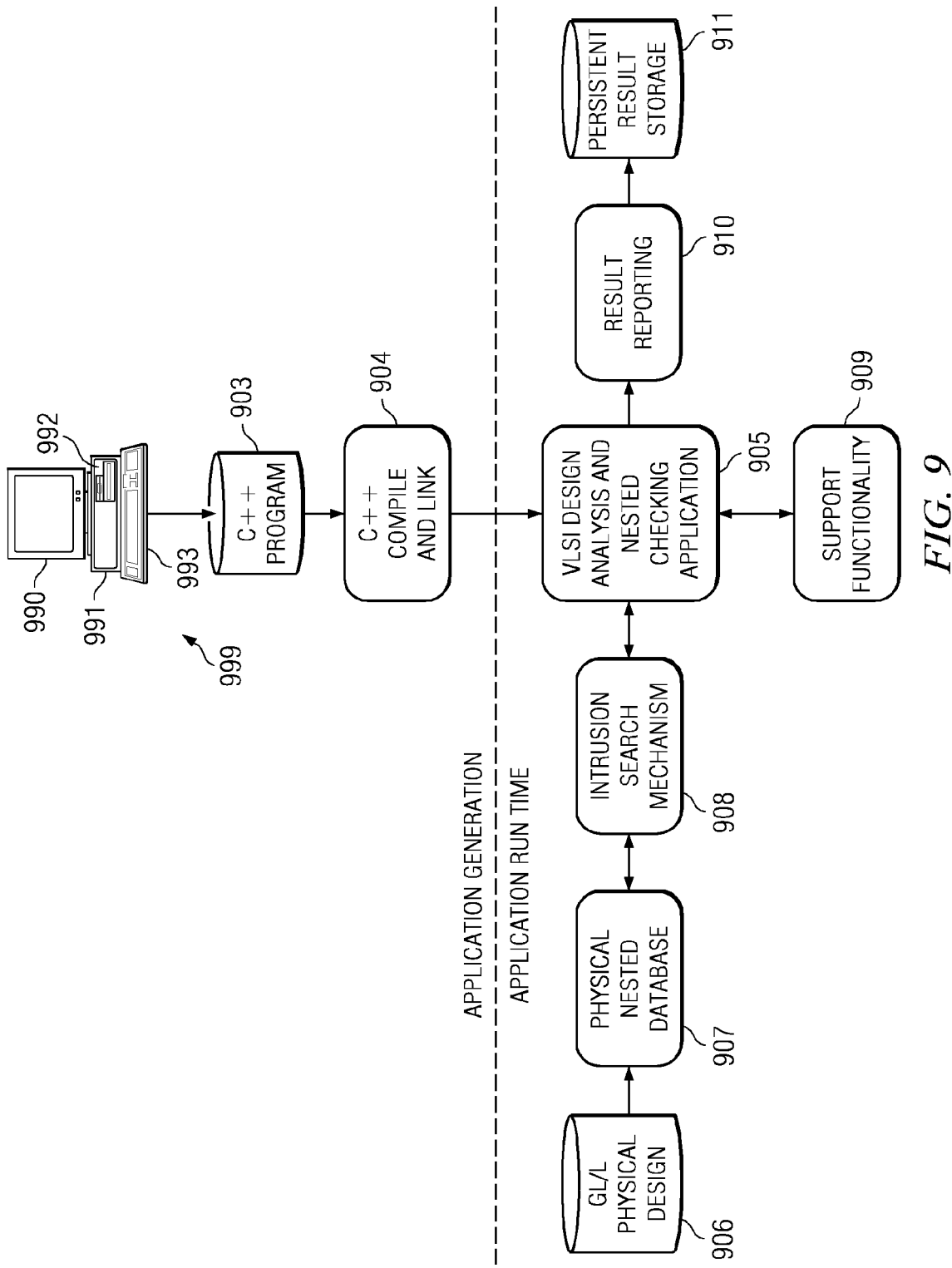
FIG. 9 is an example diagram of a high level view of a nested design verification system in which the mechanisms of the illustrative embodiments may be implemented to perform VLSI circuit design verification.

FIG. 9 is an example diagram of a high level view of a nested design verification system in which the mechanisms of the illustrative embodiments may be implemented to perform VLSI circuit design verification. As shown in FIG. 9, a computer system, shown generally at 999, is provided to control the operation and function of the verification system. Computer system 999 includes display 990, processor 991, disk drive 992, and keyboard 993. Processor 991 further includes memory (RAM) into which portions of the design verification system are loaded during execution, although execution from other storage media (e.g. ROM, bubble, EPROM, WORM, disk) is also feasible. In operation, a user interacts with the system via keyboard 993. System responses and information are communicated via display 990. Data such as physical designs, application definitions, C++ program constructs, etc. are generally stored in disk drive 992 or a larger, remotely attached disk storage subsystem (such as storage system 308 in FIG. 3), and then loaded into RAM when accessed by processor 991. However, any read/write permanent memory could be used in addition or in substitution for disk drive 992. Processor 991 executes instructions provided by the design verification system using data from its RAM and from disk drive 992. Results may be reported to the user via display 990 and/or may be accumulated in a disk file for subsequent user-evaluation.

The design verification system itself includes two basic components, application generation and application runtime. The application generation component includes the defining and generating of an application resulting in the application source code 903. The resultant application, in the depicted example, is a C++ program 903 which is coded to perform the design verification required by the application definition. While C++ is used as an example, the illustrative embodiments are not limited to such and other programming languages may be used without departing from the spirit and scope of the illustrative embodiments. The program 903 is compiled and linked at 904. The application runtime component includes the VLSI design analysis and nested checking application 905, which results from C++ compile and link step 904. The application program draws on supporting functionality, shown at 909, which includes geometry routines, graph algorithms, etc., and a separate, intrusion search mechanism 908 in accordance with one or more of the illustrative embodiments described above. The intrusion search mechanism 908 has access to physical design 906 through a physical nested database 907. Finally, results of the VLSI design analysis and nested design verification are reported at 910 and may be stored in persistent result storage 911. The results may be used as a basis for performing verification of electrical properties of the VLSI design, perform modifications to the VLSI design, or the like.

Turning in particular to the individual components shown in FIG. 9, the first step of the design verification process is application definition. This involves, in one illustrative embodiment, the definition of design rule checks and mask analysis operations using a syntactical language known as a data flow functional language (DFFL). Those operations to be computed in performing the design verification are defined using check directive statements written in DFFL.

Given an application definition expressed in DFFL, the next step in the design verification process is application generation. At this point the DFFL is analyzed by an application generator which generates a C++ shown at 903, which embodies. The C++ compile and link step, shown at 904, compiles the C++ program written by the application generator and links it with the run-time libraries to produce the executable program shown at 905.

Having generated the VLSI circuit design checking application program, the next step in the design verification process is to run the application. First, the intrusion search mechanism 908 generates intrusions by querying the nested database 907, which was previously built for the design data. The actual process of detecting intrusions is performed in the manner previously described above using the mechanisms described above to implement parallel intrusion searches in hierarchical VLSI designs using substituting scan lines. Generally, the process centers around an intrusion search iterator which locates shapes within the VLSI circuit design that come within a region of interest from one another and returns them to a calling program. Based on the intrusions found, the VLSI design is analyzed and nested checking is performed. Checking involves performing the design checks based on the detected intrusions using the run time supporting functionality 909. Finally, the results of the VLSI design analysis and nested checking activities, which may include errors, compiled statistics, etc., are collected at 910 and stored in persistent result storage 911 for later use and analysis.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for performing intrusion searching of a hierarchical integrated circuit design, comprising:
    receiving the hierarchical integrated circuit design;
    performing a parallel intrusion search operation, that utilizes a substituting scan line, on the hierarchical integrated circuit design to identify intrusions of geometric objects in the hierarchical integrated circuit design; and
    recording intrusions of geometric objects in the hierarchical integrated circuit design identified by the parallel intrusion search operation, wherein the parallel intrusion search operation utilizes a plurality of separate intrusion searches executed by the data processing system in parallel on the hierarchical integrated circuit design.

2. The method of claim 1, wherein the hierarchical integrated circuit design is an interval tree data structure that stores a set of intervals in a manner such that range queries may be applied to the set of intervals.

3. The method of claim 2, wherein the interval tree data structure is a dynamic interval tree data structure that supports dynamic updating of the dynamic interval tree data structure though insert and delete operations for inserting and deleting intervals in the dynamic interval tree data structure.

4. The method of claim 3, wherein the dynamic interval tree data structure utilizes red-black interval sub-trees.

5. The method of claim 3, wherein the dynamic interval tree data structure is built dynamically with refinements of the dynamic interval tree data structure, to add sub-trees to the dynamic interval tree data structure, being performed on internal nodes in response to the internal nodes matching criteria of a query of the parallel intrusion search operation.

6. The method of claim 3, wherein the dynamic interval tree data structure is a partially hierarchical dynamic interval tree data structure.

7. The method of claim 1, wherein performing the parallel intrusion search operation comprises:
partitioning intrusions according to a cell in the hierarchical integrated circuit design where a pair of instance paths associated with the intrusion originates.

8. The method of claim 1, wherein performing the parallel intrusion search operation comprises:
applying a substituting scan line algorithm to partition an intrusion search operation into independent tasks such that each task computes intrusions on a designated cell in the hierarchical integrated circuit design that belong to a same layer of the hierarchical integrated circuit design.

9. The method of claim 1, wherein performing the parallel intrusion search operation comprises:
providing least enclosing rectangles (LERs) of object instances of a cell in the hierarchical integrated circuit design to a feeder priority queue (FPQ), wherein the FPQ dynamically orders design object instances left to right by leftmost coordinate in the hierarchical integrated circuit design;
taking a LER of an object instance from the FPQ in a left to right order;
forming a query based on an intersection of the LER of the object instance with a scan line; and
refining a portion of the hierarchical integrated circuit design associated with the LER of the object instance based on a type of the query and a type of the object instance.

10. The method of claim 9, wherein if the type of the query is a leaf object in the hierarchical integrated circuit design, and the object instance is a leaf object in the hierarchical integrated circuit design, an intrusion is detected and output.

11. The method of claim 9, wherein if the type of the query is a cell instance LER, and the object instance is a leaf object in the hierarchical integrated circuit design, the query is refined into the scan line.

12. The method of claim 9, wherein if the type of the query is a cell instance LER, and the query hit is an internal node in the hierarchical integrated circuit design, then the internal node is refined to generate a sub-interval tree and the query is applied to the sub-interval tree.

13. The method of claim 9, further comprising:
filtering out intrusions that do not originate with the cell.

14. The method of claim 1, wherein the scan line comprises a lifetime manager that is a priority queue which dynamically orders object instances from left to right by rightmost coordinate and ordering object instances with a same rightmost coordinate in a descending manner by length of their associated instance path.

15. The method of claim 14, wherein the scan line further comprises a line search tree that is a hierarchical dynamic interval tree based on intervals obtained by intersecting least enclosing rectangles (LERs) of object instances with the scan line.

16. The method of claim 15, wherein a query causes LERs representing an object instance to be refined as far as necessary to answer the query, and wherein refining the LERs representing object instances comprises substituting objects within a LER for the object instance associated with the LER.

17. The method of claim 16, wherein refining the LERs representing object instances further comprises:
dropping substitute objects that are completely to the left of the scan line;
adding substitute objects that are intersected by the scan line to the scan line; and
adding substitute objects that are completely to the right of the scan line to the FPQ, wherein the scan line moves from a left boundary of the hierarchical integrated circuit design to a right boundary of the hierarchical integrated circuit design.

18. A computer program product comprising a non-transitory computer recordable medium having a computer readable program recorded thereon, wherein the computer readable program, when executed on a computing device, causes the computing device to:
receive a hierarchical integrated circuit design;
perform a parallel intrusion search operation, that utilizes a substituting scan line, on the hierarchical integrated circuit design to identify intrusions of geometric objects in the hierarchical integrated circuit design; and
record intrusions of geometric objects in the hierarchical integrated circuit design identified by the parallel intrusion search operation, wherein the parallel intrusion search operation utilizes a plurality of separate intrusion searches executed by the data processing system in parallel on the hierarchical integrated circuit design.

19. The computer program product of claim 18, wherein the hierarchical integrated circuit design is a dynamic interval tree data structure that stores a set of intervals in a manner such that range queries may be applied to the set of intervals, and wherein the dynamic interval tree data structure supports dynamic updating of the dynamic interval tree data structure though insert and delete operations for inserting and deleting intervals in the dynamic interval tree data structure.

20. The computer program product of claim 19, wherein the dynamic interval tree data structure is built dynamically with refinements of the dynamic interval tree data structure, to add sub-trees to the dynamic interval tree data structure, being performed on internal nodes in response to the internal nodes matching criteria of a query of the parallel intrusion search operation.

21. The computer program product of claim 18, wherein the computer readable program further causes the computing device to perform the parallel intrusion search operation by:
partitioning intrusions according to a cell in the hierarchical integrated circuit design where a pair of instance paths associated with the intrusion originates.

22. The computer program product of claim 18, wherein the computer readable program further causes the computing device to perform the parallel intrusion search operation by:
applying a substituting scan line algorithm to partition an intrusion search operation into independent tasks such that each task computes intrusions on a designated cell in the hierarchical integrated circuit design that belong to a same layer of the hierarchical integrated circuit design.

23. The computer program product of claim 18, wherein the computer readable program further causes the computing device to perform the parallel intrusion search operation by:
providing least enclosing rectangles (LERs) of object instances of a cell in the hierarchical integrated circuit design to a feeder priority queue (FPQ), wherein the FPQ dynamically orders design object instances left to right by leftmost coordinate in the hierarchical integrated circuit design;

taking a LER of an object instance from the FPQ in a left to right order;

forming a query based on an intersection of the LER of the object instance with a scan line; and refining a portion of the hierarchical integrated circuit design associated with the LER of the object instance based on a type of the query and a type of the object instance.

24. The computer program product of claim 23, wherein:

if the type of the query is a leaf object in the hierarchical integrated circuit design, and the object instance is a leaf object in the hierarchical integrated circuit design, an intrusion is detected and output;

if the type of the query is a cell instance LER, and the object instance is a leaf object in the hierarchical integrated circuit design, the query is refined into the scan line; and if the type of the query is a cell instance LER, and the query hit is an internal node in the hierarchical integrated circuit design, then the internal node is refined to generate a sub-interval tree and the query is applied to the sub-interval tree.

25. An apparatus, comprising:

a processor; and a memory coupled to the processor, wherein the memory comprises instructions which, when executed by the processor, cause the processor to:

receive a hierarchical integrated circuit design;

perform a parallel intrusion search operation, that utilizes a substituting scan line, on the hierarchical integrated circuit design to identify intrusions of geometric objects in the hierarchical integrated circuit design; and record intrusions of geometric objects in the hierarchical integrated circuit design identified by the parallel intrusion search operation, wherein the parallel intrusion search operation utilizes a plurality of separate intrusion searches executed by the data processing system in parallel on the hierarchical integrated circuit design.

* * * * *